(12) United States Patent
Komura et al.

(10) Patent No.: US 8,446,003 B2
(45) Date of Patent: May 21, 2013

(54) SEMICONDUCTOR DEVICE INCLUDING DOUBLE-SIDED MULTI-ELECTRODE CHIP EMBEDDED IN MULTILAYER WIRING SUBSTRATE

(75) Inventors: Atsushi Komura, Kariya (JP); Yasuhiro Kitamura, Chiryu (JP); Nozomu Akagi, Nukata-gun (JP); Yasutomi Asai, Okazaki (JP)

(73) Assignee: DENSO CORPORATION, Kariya (JP)

( * ) Notice: Subject to any disclaimer, the term of this patent is extended or adjusted under 35 U.S.C. 154(b) by 404 days.

(21) Appl. No.: 12/785,764

(22) Filed: May 24, 2010

(65) Prior Publication Data
US 2010/0295170 A1 Nov. 25, 2010

(30) Foreign Application Priority Data

May 25, 2009 (JP) .................................. 2009-125738
May 14, 2010 (JP) .................................. 2010-112430

(51) Int. Cl.
*H01L 23/485* (2006.01)
*H01L 23/367* (2006.01)

(52) U.S. Cl.
USPC ............ 257/700; 257/E23.019; 257/E23.102; 257/706; 257/771; 257/701; 257/774; 257/773; 257/684; 257/796

(58) Field of Classification Search
USPC .......... 257/700, 706, 771, E23.019, E23.102, 257/701, 774, 773, 684, 796
See application file for complete search history.

(56) References Cited

U.S. PATENT DOCUMENTS

| | | | |
|---|---|---|---|
| 5,753,529 A | 5/1998 | Chang et al. | |
| 7,365,438 B2 * | 4/2008 | Hedler et al. | 257/778 |
| 7,526,152 B2 * | 4/2009 | Asai et al. | 385/14 |
| 7,532,453 B2 * | 5/2009 | Yamamoto et al. | 361/306.2 |
| 7,893,542 B2 * | 2/2011 | Tachibana et al. | 257/778 |
| 7,943,861 B2 * | 5/2011 | Iwai et al. | 174/262 |
| 7,955,896 B2 * | 6/2011 | Yoshimura et al. | 438/109 |
| 8,021,748 B2 * | 9/2011 | Asai et al. | 428/323 |
| 2008/0135932 A1 | 6/2008 | Ozeki et al. | |
| 2008/0217771 A1 | 9/2008 | Tomisaka et al. | |
| 2010/0311191 A1 | 12/2010 | Tomisaka et al. | |

FOREIGN PATENT DOCUMENTS

| | | |
|---|---|---|
| JP | B2-2933830 | 5/1999 |
| JP | A-2002-208653 | 7/2002 |
| JP | A-2004-158545 | 6/2004 |
| JP | A-2008-263135 | 10/2008 |
| JP | A-2009-117501 | 5/2009 |

OTHER PUBLICATIONS

Office Action mailed Jul. 12, 2011 in corresponding JP application No. 2010-112430 (and English translation).

* cited by examiner

*Primary Examiner* — A O Williams
(74) *Attorney, Agent, or Firm* — Posz Law Group, PLC

(57) ABSTRACT

A semiconductor device includes a multilayer wiring substrate and a double-sided multi-electrode chip. The double-sided multi-electrode chip includes a semiconductor chip and has multiple electrodes on both sides of the semiconductor chip. The double-sided multi-electrode chip is embedded in the multilayer wiring substrate in such a manner that the double-sided multi-electrode chip is not exposed outside the multilayer wiring substrate. The electrodes of the double-sided multi-electrode chip are connected to wiring layers of the multilayer wiring substrate.

19 Claims, 10 Drawing Sheets

SEMICONDUCTOR DEVICE INCLUDING DOUBLE-SIDED MULTI-ELECTRODE CHIP EMBEDDED IN MULTILAYER WIRING SUBSTRATE

CROSS REFERENCE TO RELATED APPLICATION

This application is based on and incorporates herein by reference Japanese Patent Application No. 2009-125738 filed on May 25, 2009 and No. 2010-112430 filed on May 14, 2010.

FIELD OF THE INVENTION

The present invention relates to a semiconductor device where a double-sided multi-electrode chip is mounted.

BACKGROUND OF THE INVENTION

For example, U.S. Pat. No. 5,753,529, JP-2008-166705A corresponding to US 2008/0135832, and JP-2008-263135A disclose a semiconductor chip having multiple electrodes on both sides.

FIG. 12 illustrates a cross-sectional view of a semiconductor chip 10 disclosed in US 2008/0135832.

In the semiconductor chip, multiple devices including active devices 31-33, 41-43 and passive devices 51-52 are formed in a semiconductor substrate 20. The active device 31 is a bipolar transistor, the active device 32 is a complementary metal-oxide semiconductor (CMOS) transistor, the active device 33 is a lateral MOS transistor, the active device 41 is a vertical MOS transistor, the active device 42 is an insulated gate bipolar transistor (IGBT), and the active device 43 is a diode. The passive device 51 is a N⁻-type device acting as a resistor, and the passive device 52 is a N⁺-type device acting as a wire.

The semiconductor substrate 20 is a N⁻-type bulk single crystal silicon. Each of the active devices 31-33, 41-43 and passive devices 51-52 is not a thin-film device, but is integrated in the semiconductor substrate 20. The semiconductor substrate 20 is divided by insulation regions T into field regions F1-F8. The insulation regions T penetrate the semiconductor substrate 20, and each of the field regions F1-F8 is surrounded by the insulation regions T. The active devices 31-33, 41-43 and passive devices 51-52 are formed in the field regions F1-F8, respectively. As can be seen from FIG. 12, each of the active devices 31-33 has an electrode dr1 on a first side S1 of the semiconductor substrate 20. The active devices 31-33 are herein defined as "single-sided electrode devices". In contrast, each of the active devices 41-43 and the passive devices 51-52 has the electrode dr1 on the first side S1 and an electrode dr2 on a second side S2 of the semiconductor substrate 20. The active devices 41-43 and the passive devices 51-52 are herein defined as "double-sided electrode devices".

Since the semiconductor chip 10 shown in FIG. 12 can include a double-sided electrode device such as the vertical MOS transistor 41 or the IGBT 42, the semiconductor chip 10 can be used as a power semiconductor device. Further, since the semiconductor chip 10 employs a bulk single crystal silicon substrate as the semiconductor substrate 20, the double-side electrode device formed in the semiconductor substrate 20 can be resistant to a large current and a surge such as electrostatic discharge (ESD). Furthermore, since the semiconductor substrate 20 has no buried insulation layer, radiation performance of the semiconductor chip 10 can be increased to greater than that of a semiconductor chip that employs a silicon-on-insulator (SOI) substrate.

As described above, the semiconductor chip 10 has the electrodes dr1, dr2 on both sides. Such a semiconductor chip is herein defined as a "double-sided multi-electrode chip". A special structure is required to mount the double-sided multi-electrode chip to a semiconductor device.

JP-2008-263135A discloses a structure for mounting a double-sided multi-electrode chip to a silicon substrate having an electrode pattern corresponding to backside electrodes of the double-sided multi-electrode chip. JP-2008-263135A further discloses a structure for mounting the double-sided multi-electrode chip to a lead frame having through holes corresponding to the backside electrodes of the double-sided multi-electrode chip. In the structures, connection to front-side electrodes of the double-sided multi-electrode chip is performed by using a wire bonding method or a ribbon bonding method. However, it is difficult to use a wire bonding method or a ribbon bonding method, because the double-sided multi-electrode chip has electrodes on both sides. Further, when the double-sided multi-electrode chip is thin, it is likely that the double-sided multi-electrode chip is broken during manufacturing processes such as a bonding process and a resin molding process.

SUMMARY OF THE INVENTION

In view of the above, it is an object of the present invention to provide a semiconductor device where a double-sided multi-electrode chip is suitably mounted.

According to an aspect of the present invention, a semiconductor device includes a multilayer wiring substrate and a double-sided multi-electrode chip. The double-sided multi-electrode chip includes a semiconductor chip and has multiple electrodes on both sides of the semiconductor chip. The double-sided multi-electrode chip is embedded in the multilayer wiring substrate in such a manner that the double-sided multi-electrode chip is not exposed outside the multilayer wiring substrate. The electrodes of the double-sided multi-electrode chip are connected to wiring layers of the multilayer wiring substrate.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENT

Figure 1A:
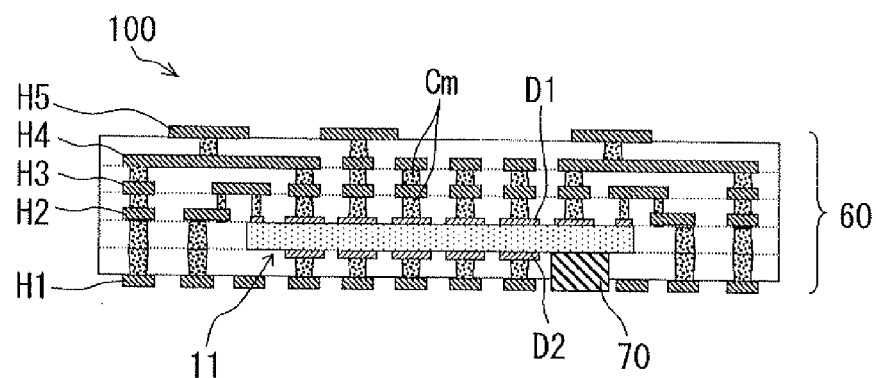
FIG. 1A is a diagram illustrating a cross-sectional view of a semiconductor device according to an embodiment of the present invention.
Figure 1B:
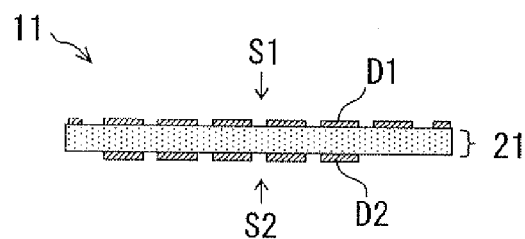
FIG. 1B is a diagram illustrating a cross-sectional view of a double-sided multi-electrode chip included in the semiconductor device of FIG. 1A.
Figure 1C:
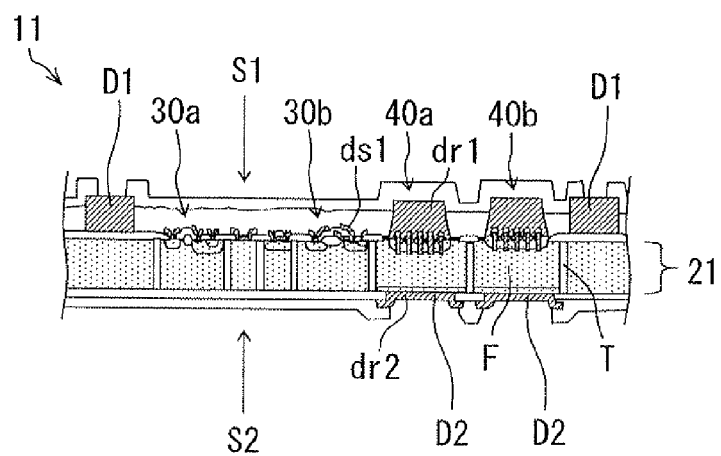
FIG. 1C is a detailed view of an example of the double-sided multi-electrode chip of FIG. 1B.

FIG. 1A is a cross-sectional view of a semiconductor device 100 according to an embodiment of the present invention. FIG. 1B is a cross-sectional view of a double-sided multi-electrode chip 11 mounted to the semiconductor device 100. FIG. 1C is a detailed view of an example of the double-sided multi-electrode chip 11.

As shown in FIG. 1A, the double-sided multi-electrode chip 11 is mounted in the semiconductor device 100 so that the semiconductor device 100 can use the double-sided multi-electrode chip 11. As shown in FIG. 1B, the double-sided multi-electrode chip 11 has multiple electrodes D1 on a first side S1 of a semiconductor chip 21 and multiple electrodes D2 on a second side S2 of the semiconductor chip 21. The first side S1 and the second side S2 are opposite to each other in a thickness direction of the semiconductor chip 21.

Figure 12:
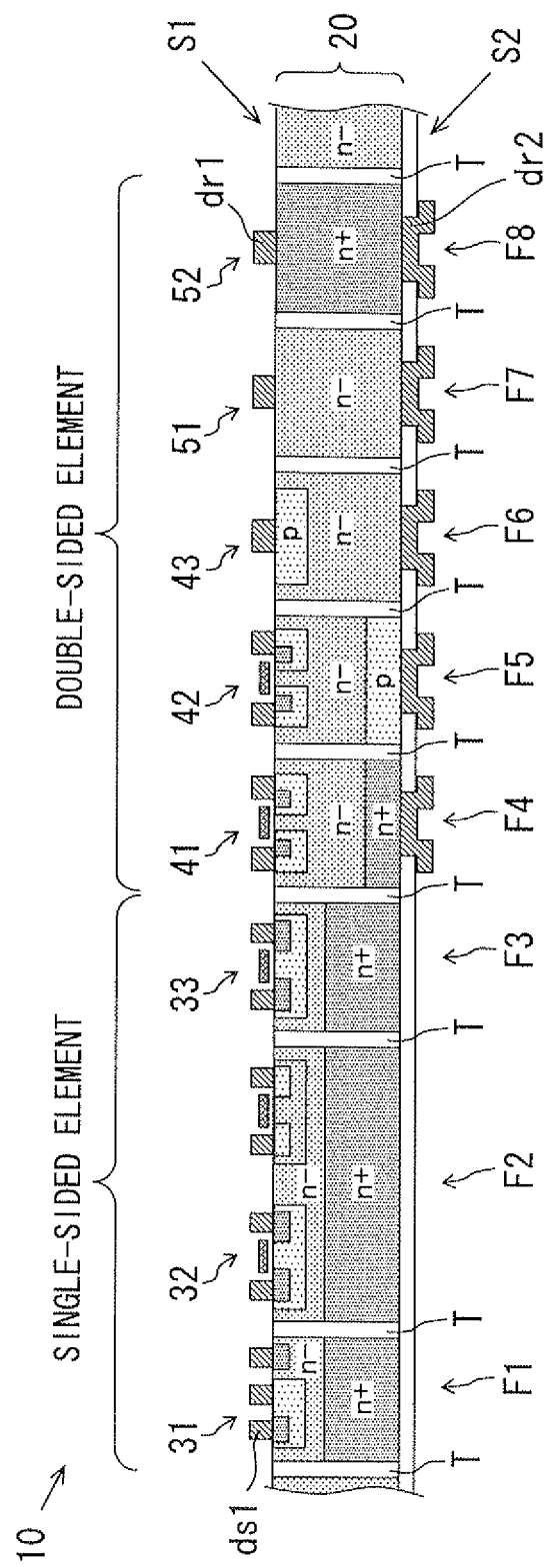
FIG. 12 is a diagram illustrating a cross-sectional view of a prior art semiconductor device.

Like the semiconductor chip 10 shown in FIG. 12, the semiconductor chip 10 can have double-sided multiple electrodes devices such as vertical MOS transistors and IGBTs formed in insulation regions and can be resistant to a large current and a surge such as electrostatic discharge (ESD). Therefore, the semiconductor chip 10 can be used for power application, for example, in a vehicle.

As shown in FIG. 1C, multiple semiconductor devices 30a, 30b, 40a, 40b are integrated into the semiconductor chip 21. The semiconductor chip 21 is divided into multiple field regions F by insulation regions T. The insulation regions T penetrate the semiconductor chip 21 in the thickness direction of the semiconductor chip 21. The field regions F are surrounded by the insulation regions T and thus electrically insulated from each other. The semiconductor devices 30a, 30b, 40a, 40b are formed in different field regions F.

Each of the semiconductor devices 30a, 30b has an electrode ds1 on the first side S1 of the semiconductor chip 21 and is energized through the electrode ds1. That is, each of the semiconductor devices 30a, 30b is configured as a single-sided electrode device.

In contrast, each of the semiconductor devices 40a, 40b has a pair of electrodes dr1, dr2 and is energized through the pair of electrodes dr1, dr2. The electrode dr1 is located on the first side S1 of the semiconductor chip 21, and the electrode dr2 is located on the second side S2 of the semiconductor chip 21. That is, each of the semiconductor devices 40a, 40b is configured as a double-sided electrode device. Specifically, each of the semiconductor devices 40a, 40b can be configured as a vertical power semiconductor device such as a vertical MOS transistor or an IGBT.

For example, the double-sided multi-electrode chip 11 can include at least one single-sided electrode device and at least two double-sided electrode devices. In this case, the single-sided electrode device can be configured to control the double-sided electrode devices.

Since the double-sided multi-electrode chip 11 has electrodes D1, D2 on both sides S1, S2 of the semiconductor chip 21, it is difficult to mount the double-sided multi-electrode chip 11 to the semiconductor device 100 by a wire bonding method or a ribbon bonding method. In particularly, when the double-sided multi-electrode chip 11 is thin (e.g., 150 μm or less), there is a possibly that the double-sided multi-electrode chip 11 may be broken during a bonding process or a resin molding process.

To suitably mount the double-sided multi-electrode chip 11 to the semiconductor device 100, the double-sided multi-electrode chip 11 is embedded in a multilayer wiring substrate 60 in such a manner that the double-sided multi-electrode chip 11 is not exposed outside the multilayer wiring substrate 60. The multilayer wiring substrate 60 includes wiring layers H1-H5. For example, the electrodes D1 of the double-sided multi-electrode chip 11 can be connected to the wiring layer H3, and the electrodes D2 of the double-sided multi-electrode chip 11 can be connected to the wiring layer H1. As described later, the multilayer wiring substrate 60 is configured as a bonded substrate that is formed by joining together multiple resin films having holes connected to the wiring layers H1-H5 and filled with conductive materials under heat and pressure.

In such an approach, the double-sided multi-electrode chip 11 can be mounted to the multilayer wiring substrate 60 without using a wire bonding method or a ribbon bonding method. Further, as describe above, the double-sided multi-electrode chip 11 is embedded in the multilayer wiring substrate 60 in such a manner that the double-sided multi-electrode chip 11 is not exposed outside the multilayer wiring substrate 60. Therefore, even when the double-sided multi-electrode chip 11 is easily broken due to its thin thickness, handing of the double-sided multi-electrode chip 11 in manufacture processes can be facilitated.

Further, the multilayer wiring substrate 60 can be used as an interposer for the double-sided multi-electrode chip 11 and can be used for rewiring of the double-sided multi-electrode chip 11.

As shown in FIG. 1C, the wiring layers H1-H5 of the multilayer wiring substrate 60 are connected together by connection conductors Cm. Further, the electrodes D1, D2 of the double-sided multi-electrode chip 11 are connected by the connection conductors Cm to the wiring layers H3, H1 of the multilayer wiring substrate 60, respectively. As described later, the connection conductors Cm are made of a sintered conductive material such as a conductive paste.

In this way, according to the embodiment, the double-sided multi-electrode chip 11 is suitably mounted to the semiconductor device 100, even when the double-sided multi-electrode chip 11 (i.e., the semiconductor chip 21) is thin.

As shown in FIG. 1A, the semiconductor device 100 can further include a heatsink 70. The heatsink 70 is embedded in the multilayer wiring substrate 60 in such a manner that the heatsink 70 is in contact with the double-sided multi-electrode chip 11. In such an approach, heat generated by the double-sided multi-electrode chip 11 can be efficiently released outside the multilayer wiring substrate 60. Although not shown in the drawings, multiple heatsinks 70 can be embedded in the multilayer wiring substrate 60 in such a manner that the heatsinks 70 are in contact with different portions of the double-sided multi-electrode chip 11. For example, the heatsinks 70 can be in contact with different field regions F of the double-sided multi-electrode chip 11. In such an approach, stress applied by the heatsinks 70 to the double-sided multi-electrode chip 11 is distributed over the double-sided multi-electrode chip 11. Therefore, it is less likely that the double-sided multi-electrode chip 11 is broken by the stress. Further, the heat generated by the double-sided multi-electrode chip 11 can be released more efficiently. In FIG. 1A, the heatsink 70 is in direct contact with the semiconductor chip 21 of the double-sided multi-electrode chip 11. Alternatively, the heatsink 70 can be in contact with the electrode D1 on the first side S1 of the semiconductor chip 21 or the electrode D2 on the second side S2 of the semiconductor chip 21.

Next, a method of manufacturing the semiconductor device 100 shown in FIG. 1A is described below with reference to FIGS. 2A and 2B.

Figure 2A:
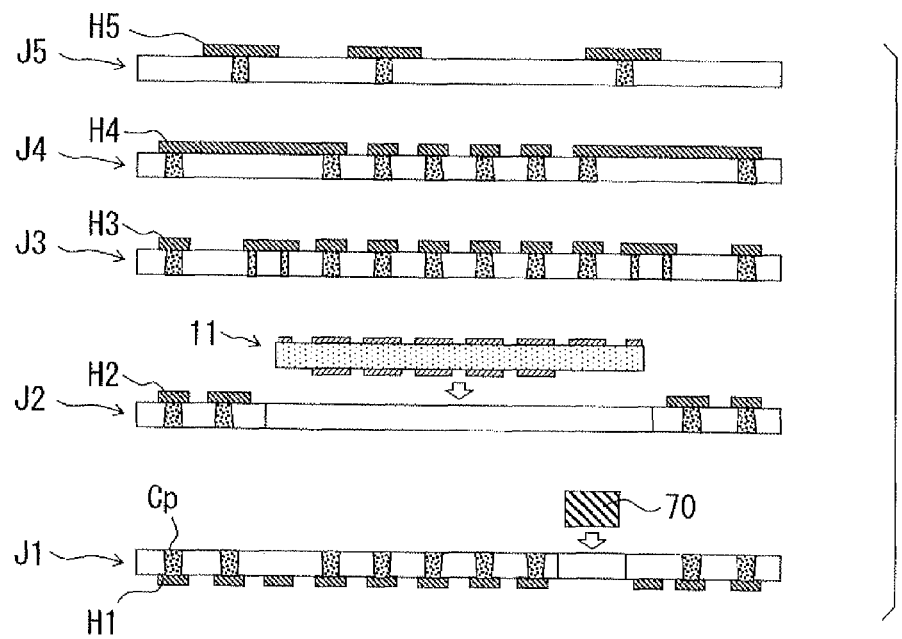
FIGS. 2A and 2B are diagrams illustrating a method of manufacturing the semiconductor device of FIG. 1A.
Figure 2B:
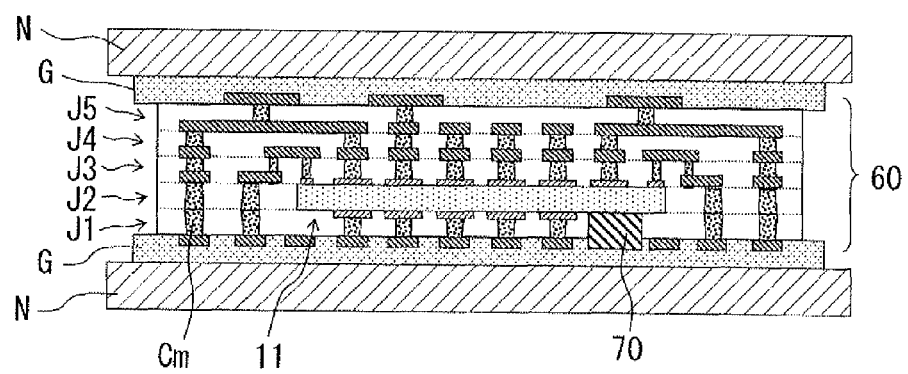

According to the method shown in FIGS. 2A and 2B, firstly, multiple resin films J1-J5 made of thermoplastics resin are prepared. The resin films J1-J5 have holes filled with conductive materials Cp such as conductive pastes. The wiring layers H1-H5 are located on bottoms of the holes of the resin films J1-J5, respectively.

Then, the resin films J1-J5, the double-sided multi-electrode chip 11, and the heatsink 70 are staked in the order shown in FIG. 2A so as to form a stacked structure.

Then, the stacked structure is inserted between heat press plates N through protection films G. Then, heat and pressure are applied by the heat pressing plates N to the stacked structure so that the resin films J1-J5 can be joined (i.e., bonded) together and that the conductive materials Cp can be sintered to the connection conductors Cm.

In this way, the multilayer wiring substrate 60 in which the double-sided multi-electrode chip 11 and the heatsink 70 are embedded is manufactured. After the multilayer wiring substrate 60 is cooled, the multilayer wiring substrate 60 is removed from the heat pressing plates N. Thus, the semiconductor device 100 is completed.

As described above, according to the method shown in FIGS. 2A and 2B, the multilayer wiring substrate 60 is manufactured by collectively joining all the resin films J1-J5 together. The multilayer wiring substrate 60 manufactured by the method shown in FIGS. 2A and 2B is herein defined as a "collectively bonded substrate". Alternatively, as shown in FIGS. 3A-3C, the multilayer wiring substrate 60 can be manufactured by sequentially joining the resin films J1-J5 together.

Figure 3A:
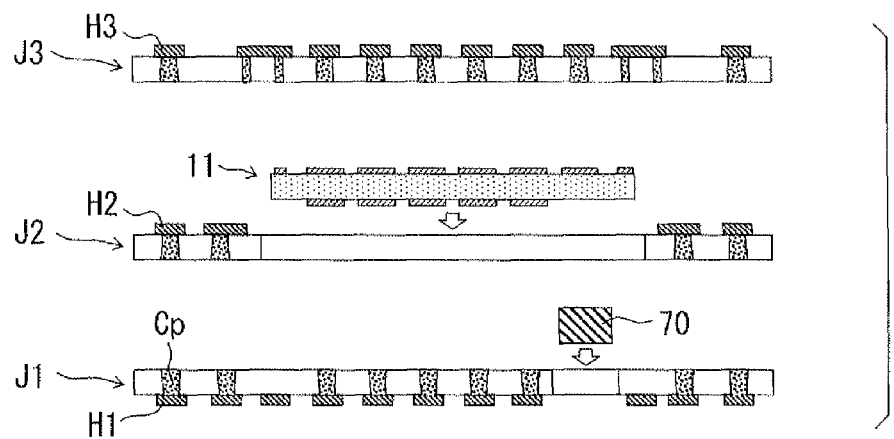
FIGS. 3A-3C are diagrams illustrating another method of manufacturing the semiconductor device of FIG. 1A.
Figure 3B:
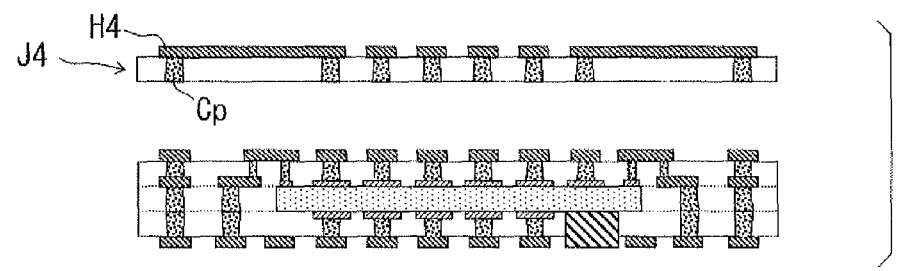
Figure 3C:
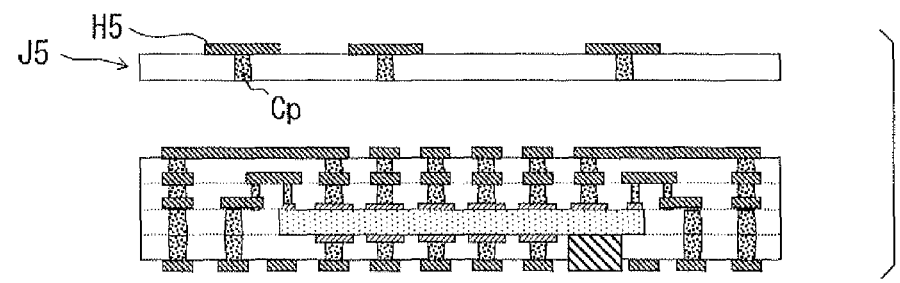

According to the method shown in FIGS. 3A-3C, three resin films J1-J3, the double-sided multi-electrode chip 11, and the heatsink 70 are staked in the order shown in FIG. 3A so as to form a first stacked structure. Then, heat and pressure are applied to the first stacked structure so that the resin films J1-J3 can be joined together. Then, the joined first stacked structure and the resin film J4 are staked in the order shown in FIG. 3B so as to form a second stacked structure. Then, heat and pressure are applied to the second stacked structure so that the resin films J1-J4 can be joined together. Then, the joined second stacked structure and the resin film J5 are staked in the order shown in FIG. 3C so as to form a third stacked structure. Then, heat and pressure are applied to the third stacked structure so that all the resin films J1-J5 can be joined together.

In this way, the multilayer wiring substrate 60 in which the double-sided multi-electrode chip 11 and the heatsink 70 are embedded can be manufactured by sequentially joining the resin films J1-J5 together. The multilayer wiring substrate 60 manufactured by the method shown in FIGS. 3A-3C is herein defined as a "sequentially bonded substrate".

An advantage of using the method shown in FIGS. 2A and 2B is that a manufacturing cost can be reduced. In contrast, an advantage of using the method shown in FIGS. 3A-3C is that rewiring of the double-sided multi-electrode chip 11a can be facilitated.

Figure 4A:
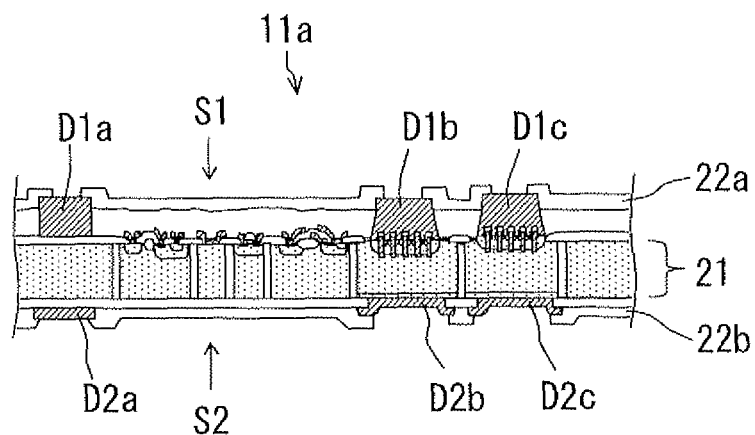
FIG. 4A is a diagram illustrating a detailed view of another example of the double-sided multi-electrode chip of FIG. 1B.
Figure 4B:
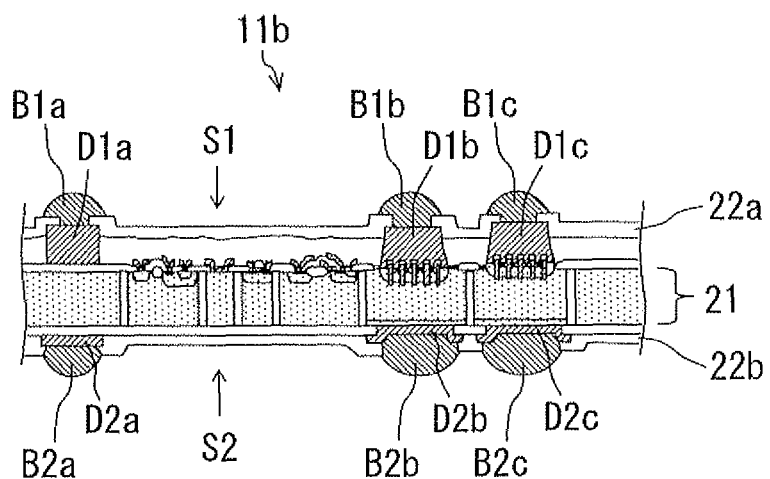
FIG. 4B is a detailed view of further another example of the double-sided multi-electrode chip of FIG. 1B.

The double-sided multi-electrode chip 11 shown in FIGS. 1B and 1C can be modified in various ways, for example, as follows. FIG. 4A is a cross-sectional view of a double-sided multi-electrode chip 11a according to a first modification, and FIG. 4B is a cross-sectional view of a double-sided multi-electrode chip 11b according to a second modification.

In each of the double-sided multi-electrode chips 11a, 11b, electrodes D1a-D1c are located on the first side S1 of the semiconductor chip 21, and electrodes D2a-D2c are located on the second side S2 of the semiconductor chip 21. It is noted that the electrodes D1a-D1c are located directly above (or below) the electrodes D2a-D2c, respectively, in the thickness direction of the semiconductor chip 21. That is, the electrodes D1a-D1c are located directly opposite to the electrodes D2a-D2c, respectively, in the thickness direction of the semiconductor chip 21.

In such an approach, when the double-sided multi-electrode chip is embedded in the multilayer wiring substrate, for example, by the method shown in FIGS. 2A and 2B, stress applied by the wiring layer to the double-sided multi-electrode chip is uniformly distributed. Therefore, it is less likely that the double-sided multi-electrode chip is broken when being embedded in the multilayer wiring substrate. It is noted that the electrodes D1a-D1c and D2a-D2c can include a dummy electrode that is not used for electrical connection.

Further, in each of the double-sided multi-electrode chips 11a, 11b, protection films 22a, 22b are formed on the first and second sides S1, S2 of the semiconductor chip 21, respectively. The protection films 22a, 22b have openings, and the electrodes D1a-D1c and D2a-D2c are exposed outside the protection films 22a, 22b through the openings. A difference of the double-sided multi-electrode chips 11b from the double-sided multi-electrode chips 11a is in that bumps B1a-B1c and B2a-B2c are formed on the electrodes D1a-D1c and D2a-D2c, respectively. The bumps B1a-B1c and B2a-B2c are connected to the electrodes D1a-D1c and D2a-D2c through the openings of the protections films 22a and 22b. That is, in the double-sided multi-electrode chip 11b, the electrodes D1a-D1c and the D2a-D2c project out from the protection films 22a, 22b.

Figure 5:
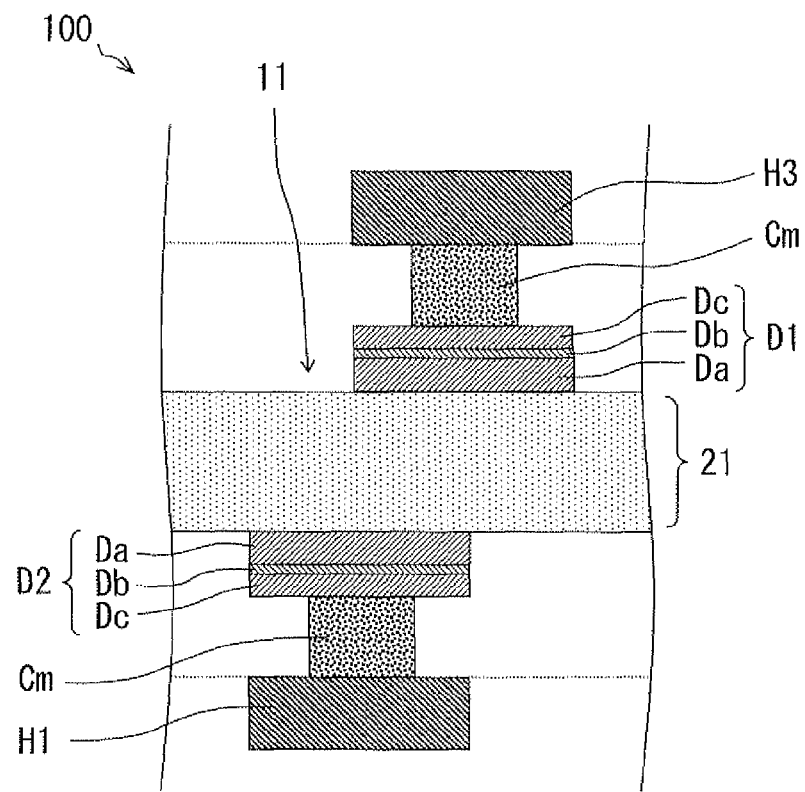
FIG. 5 is a diagram illustrating an enlarged view of FIG. 1A around electrodes of the double-sided multi-electrode chip.

Next, details of the semiconductor device 100 shown in FIG. 1A are described. FIG. 5 is an enlarged view of FIG. 1A around the electrodes D1, D2 of the double-sided multi-electrode chip 11. As shown in FIG. 5, each of the electrodes D1, D2 can have a three-layer structure including a first metal layer Da on the semiconductor chip 21, a barrier metal layer Db on the first metal layer Da, a second metal layer Dc on the barrier metal layer Db.

For example, the first metal layer Da can be made of aluminum (Al) or copper (Cu). The barrier metal layer Db can be made of titanium nitride (TiN), tungsten nitride (WN), titanium oxide (TiO$_2$), tantalum nitride (TaN). The second metal layer Dc can be made of copper (Cu) or nickel (Ni), or titanium tungsten (TiW). Aluminum and cupper are generally used for a wiring layer of a silicon semiconductor substrate. Titanium nitride, tungsten nitride, titanium oxide, tantalum nitride, and titanium tungsten can serve as a barrier for preventing metal diffusion. Copper and nickel has a good metal adhesion and a small contact resistance.

For example, the wiring layers H1-H5 can be made of copper (Cu) or nickel (Ni). The conductive material Cp can be made of a mixture of silver (Ag) powder and tin (Sn) powder. When the conductive material Cp is made of a mixture of silver powder and tin powder, the conductive material Cp can be sintered to the connection conductor Cm at a temperature (about 300° C.) at which the resin films J1-J5 are joined together, and the connection conductor Cm can have a good electrical conductivity.

The embodiment described above can be modified in various ways, for example, as follows.

Figure 6:
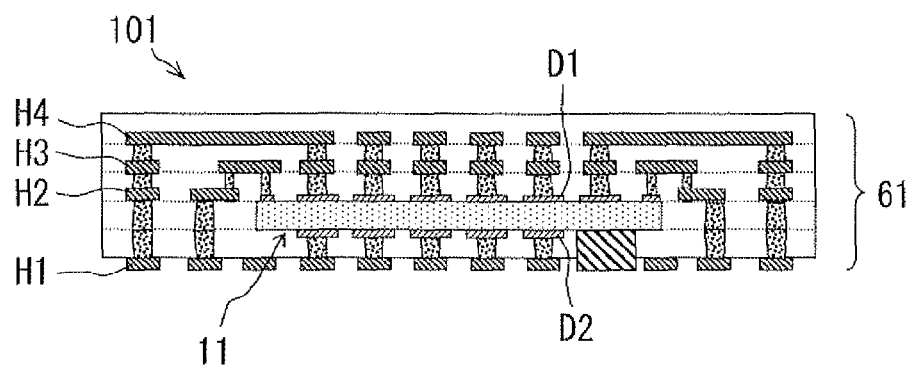
FIG. 6 is a diagram illustrating a cross-sectional view of a semiconductor device according to a first modification of the embodiment.

FIG. 6 is a cross-sectional view of a semiconductor device 101 according to a first modification of the embodiment. In the semiconductor device 100 shown in FIG. 1A, the wiring layers H1, H5 are exposed outside the multilayer wiring substrate 60. That is, the wiring layer is exposed to both side of the multilayer wiring substrate 60. In contrast, in the semiconductor device 101 shown in FIG. 6, only the wiring layer H1 is exposed outside a multilayer wiring substrate 61. That is, the wiring layer is exposed to only one side of the multilayer wiring substrate 61. In such an approach, handing of the semiconductor device 101 can be facilitated so that the semiconductor device 101 can be treated in the same manner as a resin-molded IC package.

Figure 7:
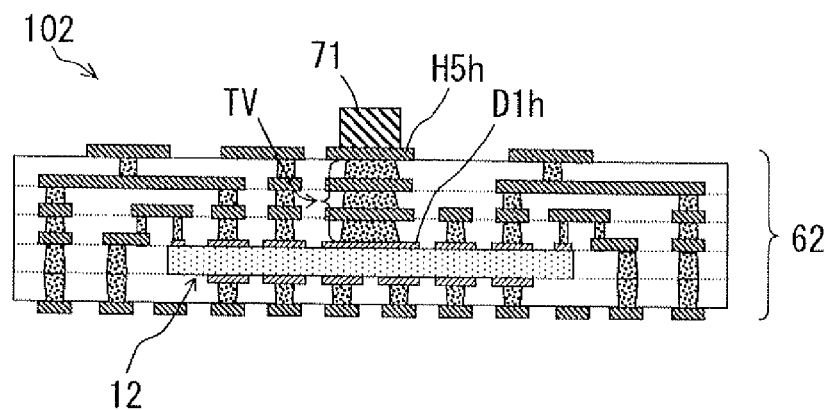
FIG. 7 is a diagram illustrating a cross-sectional view of a semiconductor device according to a second modification of the embodiment.

FIG. 7 is a cross-sectional view of a semiconductor device 102 according to a second modification of the embodiment. In the semiconductor device 100 shown in FIG. 1A, the heatsink 70 is embedded in the multilayer wiring substrate 60 in such a manner that the heatsink 70 is in contact with the double-sided multi-electrode chip 11. In contrast, in the semiconductor device 102 shown in FIG. 7, a heatsink 71 is connected to a wiring layer H5 of a multilayer wiring substrate 62. The wiring layer H5 is exposed outside the multilayer wiring substrate 62. A thermal via TV is formed in the multilayer wiring substrate 62 and extends in a thickness direction of the multilayer wiring substrate 62. A predetermined electrode D1$h$ of the double-sided multi-electrode chip 12 is connected to the wring layer H5 through the thermal via TV.

In such an approach, since the heatsink 71 is not in direct contact with the double-sided multi-electrode chip 12, stress applied by the heatsink 71 to the double-sided multi-electrode chip 12 can be reduced.

Figure 8:
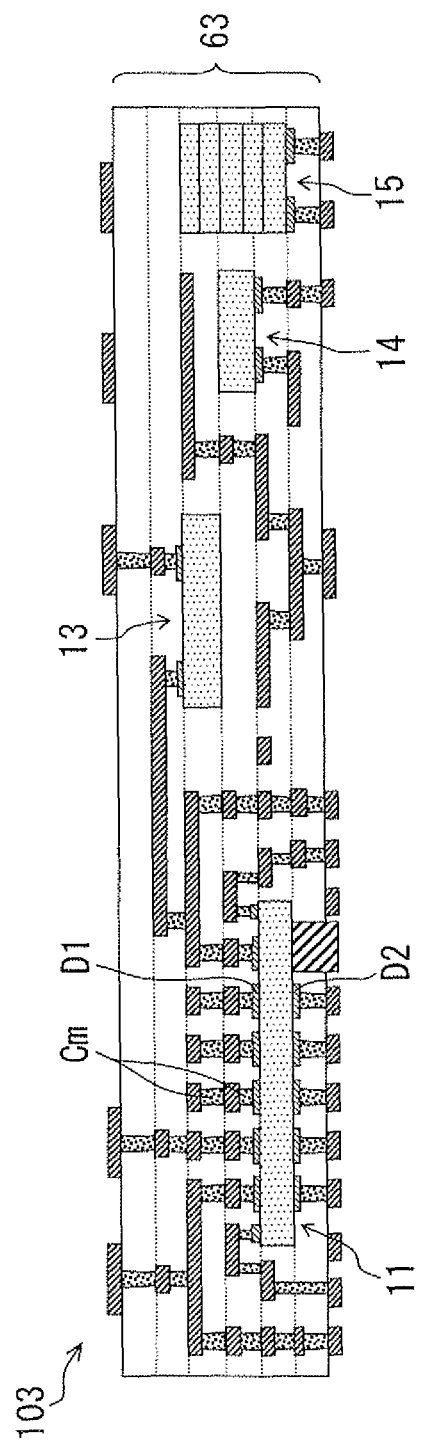
FIG. 8 is a diagram illustrating a cross-sectional view of a semiconductor device according to a third modification of the embodiment.

FIG. 8 is a cross-sectional view of a semiconductor device 103 according to a third modification of the embodiment. In the semiconductor device 103, single-sided electrodes 13, 14 and a stacked chip 15 are embedded in a multilayer wiring substrate 63 in addition to the double-sided multi-electrode chip 12. In this way, not only a double-sided multi-electrode chip but also other semiconductor chips such as a single-sided electrode chip and a stacked chip can be embedded in a common multilayer wiring substrate.

Figure 9:
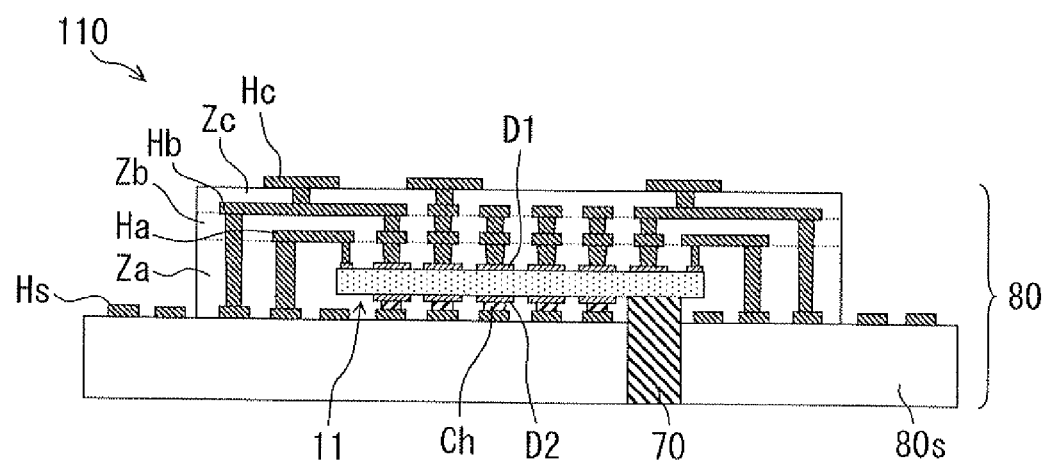
FIG. 9 is a diagram illustrating a cross-sectional view of a semiconductor device according to a fourth modification of the embodiment.

FIG. 9 is a cross-sectional view of a semiconductor device 110 according to a fourth modification of the embodiment. In the semiconductor devices 100-103, the multilayer wiring substrate 60-62 are configured as a bonded substrate formed by joining the resin films J1-J5 having the wiring layers H1-H5 under heat and pressure. In contrast, in the semiconductor device 110, a multilayer wiring substrate 80 is configured as a stacked substrate formed by alternately stacking insulation layers Za-Zc and metal layers Ha-Hc on a supporting substrate 80$s$. Specifically, the electrode D2 on the second side of the double-sided multi-electrode chip 11 is connected through a solder Ch to a wiring layer Hs formed on a surface of the supporting substrate 80$s$, so that the double-sided multi-electrode chip 11 can be mounted on the supporting substrate 80$s$. Then, the insulation layers Za-Zc and the wiring layers Ha-Hc are alternately stacked on the supporting substrate 80$s$.

In such an approach, the double-sided multi-electrode chip 11 can be mounted to the multilayer wiring substrate 80 without using a wire bonding method or a ribbon bonding method. Further, the double-sided multi-electrode chip 11 is embedded in the multilayer wiring substrate 80 in such a manner that the double-sided multi-electrode chip 11 cannot be exposed outside the multilayer wiring substrate 80. Therefore, even when the double-sided multi-electrode chip 11 is easily broken due to its thin thickness, handing of the double-sided multi-electrode chip 11 in manufacture processes can be facilitated.

Figure 10A:
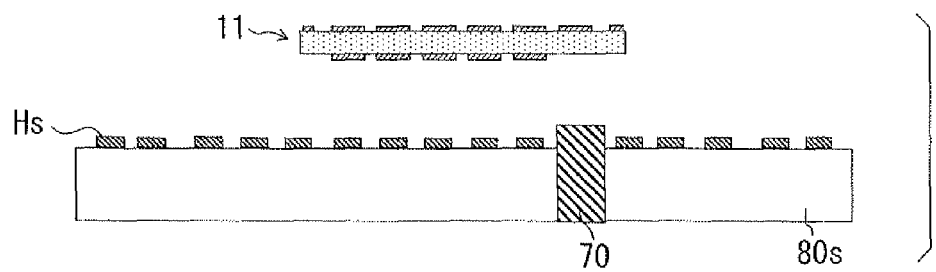
FIGS. 10A-10D are diagrams illustrating a method of manufacturing the semiconductor device of FIG. 9.
Figure 10B:
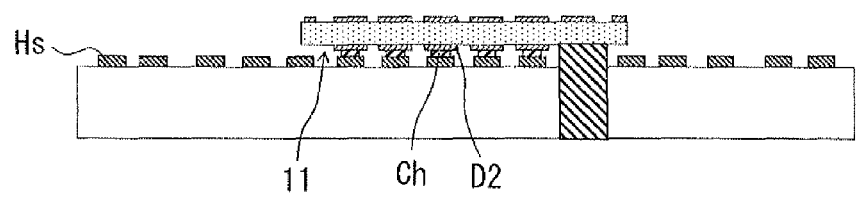
Figure 10C:
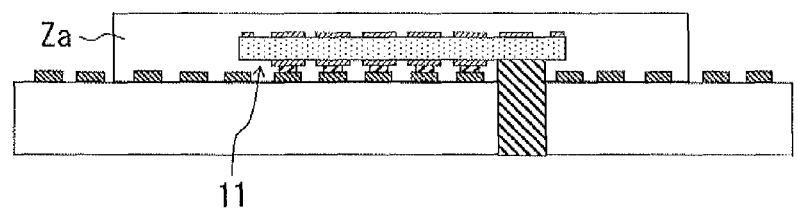
Figure 10D:
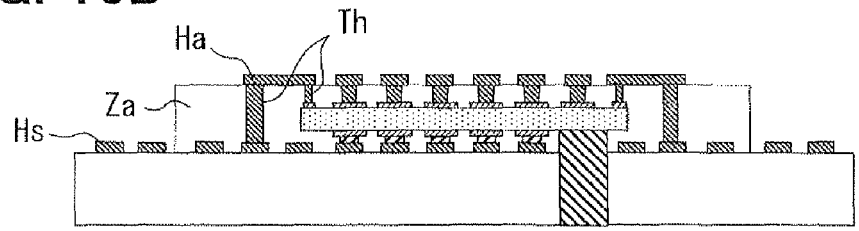
Figure 11A:
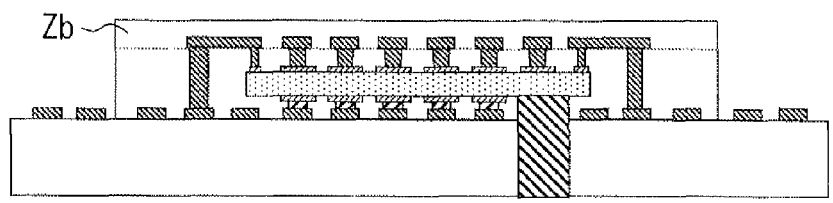
FIGS. 11A-11D are diagrams illustrating the method of manufacturing the semiconductor device of FIG. 9.
Figure 11B:
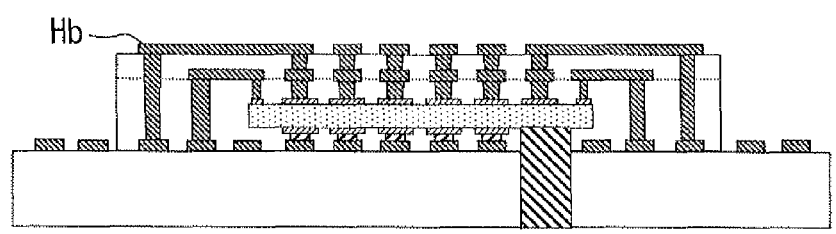
Figure 11C:
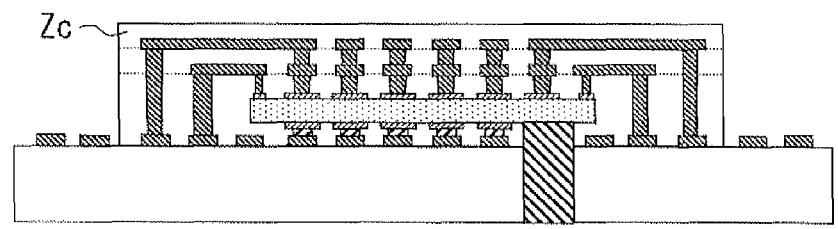
Figure 11D:
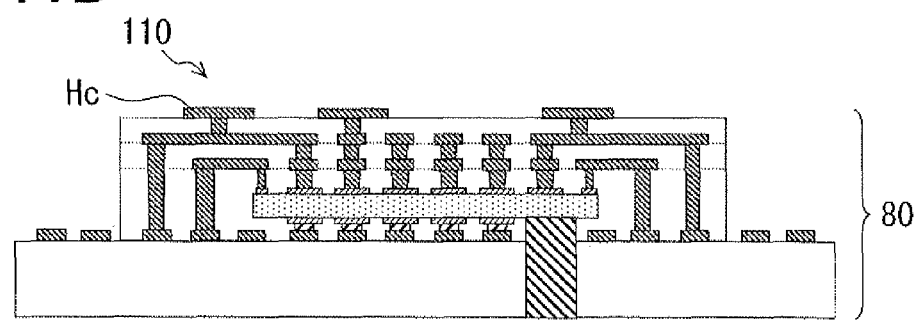

Next, a method of making the semiconductor device 110 is described below with reference to FIGS. 10A-10D and 11A-11D. Firstly, as shown in FIG. 10A, the double-sided multi-electrode chip 11 and the supporting substrate 80$s$ are prepared. It is noted that the wiring layer Hs is pre-formed on the surface of the supporting substrate 80$s$ and that the heatsink 70 is pre-embedded in the supporting substrate 80$s$. Then, as shown in FIG. 10B, the double-sided multi-electrode chip 11 is mounted on the supporting substrate 80$s$ by connecting the electrode D2 on the second side of the double-sided multi-electrode chip 11 to the wiring layer Hs on the surface of the supporting substrate 80$s$. Then, as shown in FIG. 10C, the insulation layer Za is formed on the supporting substrate 80$s$ so that the double-sided multi-electrode chip 11 can be embedded in the insulation layer Za. Then, as shown in FIG. 10D, a trench Th is formed in the insulation layer Za so that the trench Th can reach the electrode D1 on the first side of the double-sided multi-electrode chip 11 and the wiring layer Hs on the surface of the supporting substrate 80$s$. Then, the wiring layer Ha is formed on the insulation layer Za so that the trench Th can be filled with the wiring layer Ha. Then, as shown in FIG. 11A, the insulation layer Zb is formed on the wiring layer Ha. Then, as shown in FIG. 11B, the wiring layer Hb is formed on the insulation layer Zb. Then, as shown in FIG. 11C, the insulation layer Zc is formed on the wiring layer Hb. Then, as shown in FIG. 11D, the wiring layer Hc is formed on the insulation layer Zc. In this way, the insulation layers Za-Zc and the wiring layers Ha-Hc are alternately stacked on the supporting substrate 80$s$ so that the semiconductor device 110 shown in FIG. 9 can be manufactured.

As described above, according to the semiconductor device 110, the double-sided multi-electrode chip 11 is embedded in the insulation layers Za-Zc and the wiring layers Ha-Hc that are alternately stacked, after being mounted on the supporting substrate 80$s$. In such an approach, handing of the double-sided multi-electrode chip 11 in the manufacture processes can be facilitated so that it is less likely that the double-sided multi-electrode chip 11 is broken in the manufacture processes. Another advantage of the semiconductor device 110 is that rewiring of the double-sided multi-electrode chip 11$a$ can be facilitated.

In this way, the double-sided multi-electrode chip is suitably mounted to the semiconductor devices 100, 101-103, and 104 in a simple manner so that the semiconductor devices 100, 101-103, and 104 can be reduced in cost and size and can have a high reliability. Thus, the semiconductor devices 100, 101-103, and 104 can be suitably used in an apparatus mounted in a vehicle.

Such changes and modifications are to be understood as being within the scope of the present invention as defined by the appended claims.

What is claimed is:
1. A semiconductor device comprising:
a multilayer wiring substrate including a plurality of wiring layers; and
a double-sided multi-electrode chip including a semiconductor chip having first and second sides opposite to each other, the double-sided multi-electrode chip having a plurality of electrodes on both of the first and second sides of the semiconductor chip, wherein the double-sided multi-electrode chip is embedded in the multilayer wiring substrate in such a manner that the double-sided multi-electrode chip is not exposed outside the multilayer wiring substrate, and the plurality of electrodes is connected to the plurality of wiring layers.

2. The semiconductor device according to claim 1, wherein at least one of the plurality of electrodes has a three-layer structure including a first metal layer on the semiconductor chip, a barrier metal layer on the first metal layer, and a second metal layer on the barrier metal layer.

3. The semiconductor device according to claim 2, wherein the first metal layer is made of aluminum or copper, the barrier metal layer is made of titanium nitride, tungsten nitride, titanium oxide, or tantalum nitride, and the second metal layer is made of copper or nickel.

4. The semiconductor device according to claim 1, wherein the plurality of wiring layers is made of copper or nickel.

5. The semiconductor device according to claim 1, wherein the multilayer wiring substrate is configured as a bonded substrate that is formed by joining together a plurality of thermoplastic resin films under heat and pressure, the plurality of thermoplastic resin films having a plurality of holes connected to the plurality of wiring layers and filled with a conductive material.

6. The semiconductor device according to claim 5, wherein the double-sided multi-electrode chip is embedded in the multilayer wiring substrate by arranging the plurality of thermoplastic resin films and the double-sided multi-electrode chip in a predetermined order and by joining together the plurality of thermoplastic resin films and the double-sided multi-electrode chip under heat and pressure so that the conductive material is sintered.

7. The semiconductor device according to claim 5, wherein one of the plurality of wiring layers defines an exposed surface of the double-sided multi-electrode chip.

8. The semiconductor device according to claim 5, wherein the conductive material is made of a mixture of silver powder and tin powder.

9. The semiconductor device according to claim 1, wherein the multilayer wiring substrate is configured as a stacked substrate including a supporting substrate, a plurality of insulation layers, and the plurality of wiring layers, the double-sided multi-electrode chip is located on the supporting substrate, and the plurality of insulation layers and the plurality of wiring layers are alternately stacked on the supporting substrate so that the double-sided multi-electrode chip is embedded in the multilayer wiring substrate.

10. The semiconductor device according to claim 1, wherein the plurality of electrodes on the first side of the semiconductor chip is located directly opposite to the plurality of electrodes on the second side of the semiconductor chip in a direction from the first side to the second side of the semiconductor chip.

11. The semiconductor device according to claim 1, wherein the semiconductor chip has a plurality of semiconductor devices and is divided into a plurality of field regions by an insulation region extending from the first side to the second side of the semiconductor chip, each of the plurality of semiconductor devices is located in a different one of the plurality of field regions, and the plurality of semiconductor devices comprises at least two double-sided electrode devices, each double-sided electrode device having a pair of electrodes through which the double-sided electrode device is energized, one electrode of the pair is located on the first side of the semiconductor chip, and the other electrode of the pair is located on the second side of the semiconductor chip.

12. The semiconductor device according to claim 11, wherein the double-sided electrode device is a vertical power semiconductor device.

13. The semiconductor device according to claim 11, wherein the plurality of semiconductor devices comprises at least one single-sided electrode device having at least one electrode through which the single-sided electrode device is energized, all of the at least one electrode of the single-sided electrode device is located on one of the first side and the second side of the semiconductor chip, and the single-sided electrode device is configured to control the double-sided electrode.

14. The semiconductor device according to claim 1, wherein the semiconductor chip includes a protection film on at least one of the first side and second side, the protection film having a plurality of openings, and the plurality of electrodes is exposed through the plurality of openings of the protection film.

15. The semiconductor device according to claim 1, wherein the semiconductor chip includes a protection film on at least one of the first side and second side, and the plurality of electrodes projects out from the protection film.

16. The semiconductor device according to claim 1, further comprising:

a heatsink embedded in the multilayer wiring substrate and in contact with the double-sided multi-electrode chip.

17. The semiconductor device according to claim 16, wherein the heatsink comprises a plurality of heatsink members in contact with different portions of the double-sided multi-electrode chip.

18. The semiconductor device according to claim 1, further comprising:

a heatsink, wherein one of the plurality of wiring members defines an exposed surface of the multilayer wiring substrate, the multilayer wiring substrate includes a thermal via having a first end connected to at least one of the plurality of electrodes of the double-sided multi-electrode chip and a second end connected to the one of the plurality of wiring members of the multilayer wiring substrate, and the heatsink is connected to the one of the plurality of wiring members of the multilayer wiring substrate.

19. The semiconductor device according to claim 1, wherein the semiconductor device is used in an apparatus mounted on a vehicle.

* * * * *